United States Patent [19]

Ohno

[11] 4,211,618
[45] Jul. 8, 1980

[54] METHOD FOR MAKING SCREENS

[75] Inventor: Yoshio Ohno, Tokyo, Japan

[73] Assignees: Kabushiki Kaisha Kenseido; Toppan Printing Co. Ltd., both of Tokyo, Japan

[21] Appl. No.: 906,611

[22] Filed: May 16, 1978

[30] Foreign Application Priority Data

May 24, 1977 [JP] Japan ................................ 52-59395

[51] Int. Cl.$^2$ ................................ C25D 1/08
[52] U.S. Cl. ................................ 204/11; 101/128.21; 101/128.4; 204/17; 204/24; 427/259; 427/264; 430/307; 430/308
[58] Field of Search ................................ 204/17, 11, 24; 427/259, 264, 247; 101/128.3, 128.4, 128.2

[56] References Cited

U.S. PATENT DOCUMENTS

| 210,446 | 12/1878 | Bodeustein | 427/264 X |
| 2,051,603 | 8/1936 | Hruska | 427/264 X |
| 2,226,383 | 12/1940 | Norris | 204/11 |
| 4,039,397 | 8/1977 | Klemm | 204/11 |

OTHER PUBLICATIONS

Weast, Robert C. (editor), *Handbook of Chemistry and Physics*, 54th edition, 1973, Cleveland, Ohio, CRC Press, p. F-225.

*Primary Examiner*—Evan K. Lawrence
*Attorney, Agent, or Firm*—Armstrong, Nikaido, Marmelstein & Kubovcik

[57] ABSTRACT

A method for producing rotary or flat screens having large amounts of open space per unit area comprises plating a master roll or plate having a pattern of conductive metal and non-conductive areas on its surface with a plurality of separate coats of metal coating on the conductive areas to build up a plurality of spaced projecting metal parts having a required thickness, applying a non-electrically-conductive resin onto the entire surface of the metal coating between each plating step, and removing in each step only the portions of the applied resin on the top of each projecting metal part. This is accomplished while the resin is in an undried state with a non-metallic roll or flat plate having a receptivity to the resin to expose the surface of the metal coating formed by plating.

6 Claims, 9 Drawing Figures

METHOD FOR MAKING SCREENS

BACKGROUND OF THE INVENTION

The present invention relates to a method for producing rotary and flat screens including halftone screens containing images for printing. More particularly, it relates to a method for producing screens for printing having a superior opening ratio, by dividing the plating operation into a plurality of independent steps of platings. The opening ratio herein referred to means a ratio of area of opening part to the sum of area of non-opening part and area of opening part.

The method of the present invention will be illustrated referring to the attached drawings.

FIG. 3-1 shows a schematic cross-sectional view illustrating the state where a large amount of a resin was applied, followed by drying and polishing and the projected parts of metal coating are exposed.

FIG. 3-2 shows a schematic cross-sectional view illustrating the state where the amount of resin applied was reduced, and the projected parts are exposed.

Figure 1:
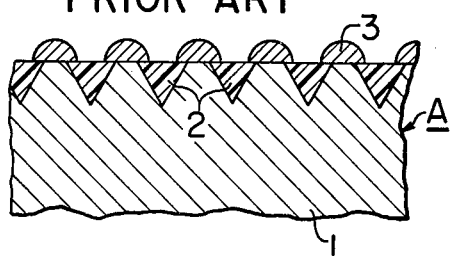
FIG. 1 shows a schematic cross-sectional view illustrating a sleeve for rotary screen printing prepared according to the conventional method and adherence of a resin.
Figure 2:
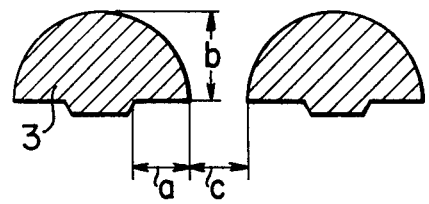
FIG. 2 shows a schematic cross-sectional view illustrating the state of adhesion of metal coating formed by plating which will be abbreviated hereinafter as metal coating.

Nowadays, a sleeve for rotary screen printing has been produced according to the conventional method. The cross-sectional views thereof are shown in FIG. 1 and FIG. 2. "A" in FIG. 1 is called a master roll or plate, which has projections and recesses provided on the surface thereof and further has a non-electrically-conductive resin 2 embedded therein to form a surface having a pattern of conductive metal and non-conductive areas. Since the master roll A is prepared with a metal 1, a metal coating 3 is deposited on the exposed parts of the metal 1 of the master roll A by carrying out plating treatment in a plating bath. At that time, as seen from FIG. 1, the metal coating 3 coats the non-electrically-conductive resin 2, increasing the thickness thereof. when using this method, as shown in FIG. 2, the thickness "b" of the metal coating 3 is almost the same in dimension as the portion "a" laterally widened to coat the non-electrically-conductive resin. Thus such a method has a drawback that the opening portion c becomes very small.

SUMMARY OF THE INVENTION

The object of the present invention is to provide a method for producing screens without the disadvantages involved in the conventional method for producing screens and having a superior opening ratio.

The above-mentioned object is achieved according to the method of the present invention.

The method of the present invention is directed to a method for producing screens wherein the master roll or plate is plated with metal on the conductive areas and the thickness of metal required is not obtained with one plating step. The plating is divided into a plurality of steps to obtain the thickness of metal required. A non-electrically-conductive resin is uniformly applied before each of the platings. While the non-electrically-conductive resin is in an undried state, the portions of the resin on the top of the projecting parts of the metal coating are removed by contacting them with a non-metallic material having a receptivity to the resin to coat the side wall parts of the recesses of the metal coating and other parts with the non-electrically-conductive resin after drying, a subsequent plating step follows, whereby screens having almost vertical side walls of the metal coating and a superior opening ratio can be obtained.

DETAILED DESCRIPTION OF THE INVENTION

Figures 1, 3:
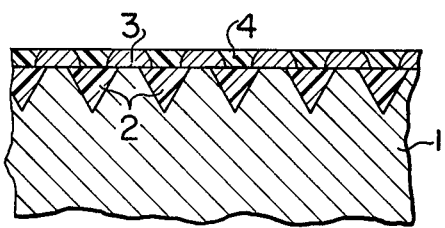
Figure 4:
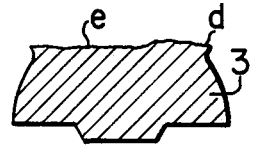
FIG. 4 shows a schematic cross-sectional view illustrating the state where the metal coating part was roughened due to polishing and unevenness occurred at the top parts.
Figures 2, 3:
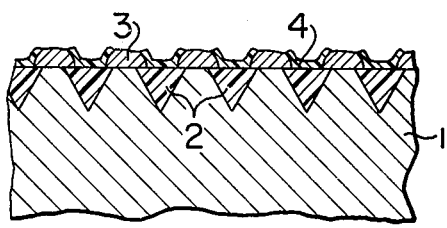

As for the method for improving the opening ratio, it is necessary to fill a non-electrically-conductive resin (which will be hereinafter abbreviated merely as "resin") in the holes in order to inhibit the growth of metal coating in the side direction. For this purpose, the inventor of the present invention employed a method of divided plating wherein screens were produced in a manner illustrated in FIGS. 3 and 4. FIG. 3-1 shows a screen obtained by applying a large amount of the resin 4, and after drying, polishing with sand paper or the like to expose the projected parts of the metal coating 3. FIG. 3-2 shows a screen obtained by employing a small amount of the resin applied and after drying, bringing the projected parts of the metal coating 3 to exposure by polishing with sand paper or the like. According to these methods, however, it was found that, as shown in FIG. 4, the top of the projecting part of the metal coating 3 is shaved off due to polishing treatment, and as a result, the coating part e is roughened. At the same time, uneven polished parts d are formed on the side portions of the metal coating part e due to polishing unevenness. Thus a terminal current is formed there at the time of replating step, and the growth of plating increases there, resulting in a large unevenness and dispersion of opening ratio.

According to the method of the present invention, polishing is not carried out on the entire surface of the resin coating, only the portion thereof at the top of the projecting part of the metal coating is removed by contacting it with a non-metallic material. The material has a receptivity to the resin accordingly, the method allows for plating without producing unevenness. Therefore, one can obtain a screen having a superior opening ratio.

The steps will be briefly illustrated below.

1. A resin is embedded in the surface of metal, or a membrane of photosensitive resin is formed there to prepare non-electrically-conductive parts (the resulting material is called a master roll or plate), and thereafter, for example, in case of preparing a nickel screen, a first time nickel plating is carried out.

Figure 5:
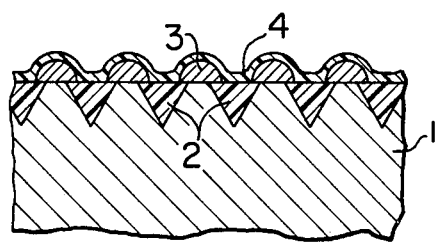
FIG. 5 shows a schematic cross-sectional view illustrating the state where a resin solution was applied over the whole surface of the metal coating.

2. Next, a solution containing a resin dissolved therein is applied over the whole surface. The resulting state is as shown in FIG. 5. As for the applying manner, any of the manners which are carried out by means of spraying, doctor coating, roll coating, etc. may be employed.

Figure 6:
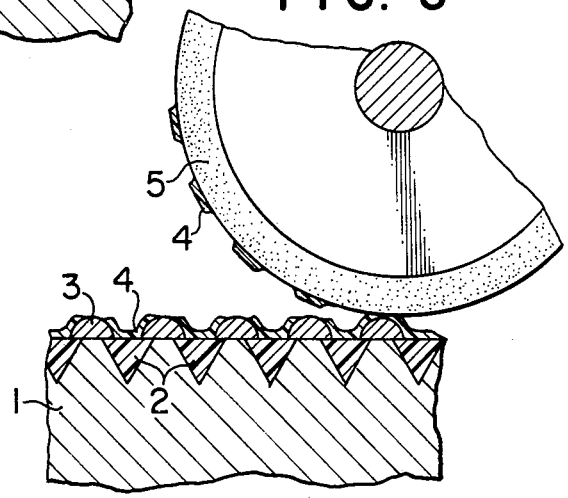
FIG. 6 shows a schematic cross-sectional view illustrating the state where the resin on the projected parts of the metal is removed by rolling a rubber roll.

3. In the undried state, i.e. just after the application, for example, if a non-metallic material having a good ink-receptivity such as a roller or a flat plate of rubber is rolled uner a fixed pressure on the surface having the resin applied thereto, a state as shown in FIG. 6 is brought about. Numeral 5 in FIG. 6 shows a rubber-lined roll. As for the resin 4, portions thereof at the projecting parts of the metal coating 3 are adhered onto the rubber 5, while other portions remain on the application surface, as they are.

4. Next, after drying, plating is again carried out in a plating bath. As for the drying, any conventional drying method may be employed. After drying, it is also possible to subject the exposed parts of the metal to treatments such as degreasing, activation, etc. in order to increase the adhesion of metal to metal e.g. nickel to nickel in the case of the present invention.

Figure 7:
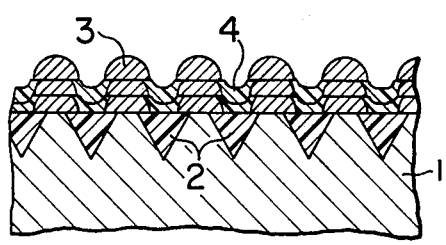
FIG. 7 shows a schematic cross-sectional view illustrating the state obtained after the plating and resin-removal steps are repeated.

5. By repeating the above-mentioned steps, a state as shown in FIG. 7 is brought about.

Figure 8:
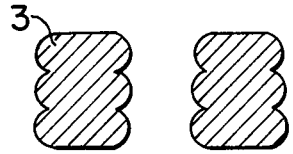
FIG. 8 shows a schematic cross-sectional view illustrating the state where the resin was removed and thereafter the screen was peeled off from the master roll or plate.

6. Next, the resin 4 is removed and the resulting material is peeled off from the master roll or plate. Thus a state as shown in FIG. 8 is formed. The peeled off material from the master roll is called a sleeve or sleeve screen. As a result a metal screen having almost vertical sides and a superior opening ratio can be obtained.

According to the method of the present invention, it is possible to produce either a cylindrical screen or flat screen, and yet, in case of an image-containing halftone screen, it is possible to produce a screen faithful to the original image, at a cheap cost and with certainty. Thus the commercial value of the method of the present invention is very great.

In the method of the present invention, as methods for forming a non-electrically-conductive part by embedding resin such as a thermosetting epoxy resin or by shaping a photosensitive resin membrane i.e. as methods for producing a master roll or plate, there are the following methods:

In a lacquer process, copper plating is applied onto a metal roll or a plate made of iron or the like and the finished surface of copper plating is polished with a polishing machine. Then by using a mill roll (matrix form) having been tempered to give a high hardness and also a pushing machine, the finished surface of copper coating is engraved, the resultant whole engraved surface is subjected to chromium plating or hard nickel plating and then recesses of said engraved surfaces are embedded with a non-electrically-conductive resin e.g. a thermosetting type epoxy resin. Thus a master roll or plate is obtained.

In an electroplate process, copper plating is applied onto an iron roll, after polishing by a polishing machine, chromium plating or hard nickel plating is applied to give a finished roll or plate. A stainless steel roll or plate is polished and thus an electroplate master roll or plate is obtained. On the resulting finished roll, a layer of photosensitive resin membrane is formed by a spraying process or a ring coating process or the like in case of liquid state or by pressure-adhesion carried out under heating in case of film state. Then a negative image film containing penetrating type mesh is contacted and said film surface is exposed to light by using a xenon lamp, a ultraviolet lamp, etc. After the layer of the resin membrane of the exposed portions is cured, the layer of the resin membrane of the unexposed portions is removed by dissolving by using a developer such as water, organic solvents or the like to form a photosensitive resin layer in the shape of image on the roll or plate.

As photosensitive resins or films, there can be mentioned photosensitive resins or rubbers having a diazo group such as diazonium salts, quinonediazides, photosensitive resins having a cinnamoyl group such as polyvinyl cinnamate, etc. and photosensitive resins having an acryloyl group such as nylon, acryl amides, acrylates, etc.

As developers, there can be mentioned water or an aqueous solution of weak alkali for lower molecular weight compounds and an organic solvent such as alcohol, xylol, trichlene, etc. for higher molecular weight compounds.

As for the non-electrically-conductive resins employed in the method of the present invention, most of the resin can be generally employed. For example, methyl methacrylate resin, polybutyral resin, alkyd resin, phenol resin (novolac type), epoxy resin, polyvinyl chloride resin, polyvinylidene resin, polyvinyl acetate resin, polystyrene resin, polyacrylate resin, polyethylene resin, polyurethane resin, xylene resin, polyvinyl formal resin, toluene resin, etc. are included therein. These resins can be used together with a plasticizer.

As for the solvents for the resin of the present invention, those having a boiling range of 50°–300° C. are preferable. Although those having a boiling point lower than 50° C. can be employed, there is not sufficient time for operation, since it is necessary to use them as soon as the resin solution is applied.

Illustrative solvents ar ethyl acetate, xylene, methyl cellosolve acetate, methyl cellosolve, cellosolve acetate, butyl cellosolve, benzene, toluene, mixtures of these compounds.

Preferably combinations of resins and solvents useful in the method of the present invention can be enlisted as follows:

methyl methacrylate resin: methyl ethyl ketone (MEK), benzene, toluene polyvinyl butyral resin: methanol, ethanol, methyl cellosolve acetate, acetone, methyl ethyl ketone (MEK), cellosolve, etc.

alkyde resin: xylene, ethyl acetate cellosolve, methyl cellosolve, benzene, etc.

phenol resin (novolak type): methanol, ethanol, isopropanol, benzene, etc.

epoxy resin: xylene, cellosolve acetate, butyl cellosolve, benzene, etc.

polyvinyl chloride resin: MEK, methyl isobutyl ketone (MIBK), cyclohexanone, etc.

polyvinylidene resin: MEK, MIBK, cyclohexanone, etc.

polyvinyl acetate resin: xylene, methyl cellosolve acetate, cellosolve acetate, benzene, etc.

polystyrene resin: xylene, toluene, etc.

polyacrylate resin: xylene, benzene, etc.

polyethylene resin: xylene, ethanol, methyl cellosolve, etc.

polyurethane resin: used in liquid state by itself xylene resin: ethyl acetate, xylene, methyl cellosolve, benzene, etc.

polyvinyl formal resin: ethanol, methyl acetate, acetone, MEK, cellosolve, etc.

polybutene resin: xylene, cellosolve, etc.

The above-mentioned are examples of mutually soluble solvents but they are used in the form of single solvent or mixtures thereof. They are used both in the form of solution or emulsion.

The plating bath used in the method of the present invention is not of a special kind and commonly used nickel salt of sulfamic acid bath, nickel salt of sulfuric acid bath, etc. can be used. For example, in case of nickel sulfamate bath, the following recipe is preferable*:

|  | range |
| --- | --- |
| Nickel sulfamate | 550 g/l (500 to ~ 600 g/l) |
| Boric acid | 40 g/l (35 to ~ 50 g/l) |
| Nickel bromide | 7 g/l (5 to ~ 10 g/l) |
| Sodium 1,3,6-naphthalene sulfonate | 7 g/l (2 to ~ 10 g/l) |
| Sodium lauryl sulfate | 0.05 g/l (<0.1 g/l) |

*Hereinafter the symbol "~" will denote "about"

The values in the bracket show the ranges which are satisfactory.

Plating condition is a commonly used one which is shown below:
bath temperature: 45° to ~60° C.
pH: 4.0 to ~4.5
current density: 8 to ~20 A/dm$^2$
voltage: 9 to ~11 V
anode: electrolytic nickel According to the present invention, any of the mixtures of compounds and any of the conditions in the indicated ranges may be used in the plating bath.

As for the non-metallic materials employed for removing the resin at the projected parts of metal coating in the method of the present invention, it is necessary to employ natural or synthetic rubbers having a suitable hardness and a compatibility with the above-mentioned non-electrically-conductive resins. As such, natural rubber (polyisoprene), nitrile rubber (acrylonitrile-butadiene copolymer), styrene rubber (styrene-butadiene copolymer), neoprene rubber, ethylene-propylene rubber, Hypalon (chlorosulfonated polyethylene), polyisoprene synthetic rubber, polyacrylate rubber (acryl ester copolymer), polybutadiene rubber, urethane rubber, silicone rubber, fluorine rubber (hexafluoropropylene) are effective. The hardnesses of the plate or roll of these rubbers are in the range of 10 to ~100 in terms of Shore hardness. As for the roll pressure, a pressing under 0.5 to ~10 Kg/24.5 cm, preferably 1 to ~4 Kg/24.5 cm is preferable. If the resin thickness is 10 to ~100 μm or less, one step removal may be sufficient, but if the thickness exceeds the above-mentioned range, two pressing operations are necessary.

The screen produced according to the present invention can be used, in addition to a screen for printing, in grill cutters of an electric shaver, filters, e.g. filter for juicer, etc. Following examples are presented to further illustrate the method of the present invention.

EXAMPLE 1

The surface of a master roll obtained by engraving and then stuffing an epoxy resin at a rate of 80 lines/inch on the surface of a metal (prepared by engraving) having a circumference of 640 mm and a surface length of 400 mm was plated in a bath of nickel sulfamate so as to give a thickness of 40 microns. The resulting master roll was taken out and dried, and as a coating solution, 20% polyvinyl acetate solution in butyl cellosolve was spread by means of a usual rubber roll, was uniformly applied onto the master roll. Next, before the coating solution dried, the master roll having the coating solution applied was contacted with a rubber roll having a Shore hardness of 30, a circumference of 400 mm and a surface length of 300 mm. The rubber roll was rotated under a load of 10 Kg synchronously with the master roll, at a rate of 3 cm/sec and the master roll was rotated twice, and then the natural rubber roll was removed. The resulting master roll was dried with a hot air (80° C.) till the coating solution did not stick to hand in contact therewith, followed by degreasing with a sponge having a precipitated calcium carbonate dissolved in water, attached thereon, water-washing and application of 5% nitric acid aqueous solution. The resulting master roll was again plated in a nickel plating bath so as to give a thickness of 40 microns. As a result, in case of plating carried out so as to give a thickness of 80 microns, platings carried out in two divided steps could yield a hole diameter of 160 microns, whereas one step plating yielded a hole diameter of 80 microns. Namely, it has become possible to produce such a screen that the hole diameter does not become small due to plating. Thus, a high mesh screen having a small hole diameter e.g. 150 mesh could be easily produced, and the object of the method of the present application could be fully attained.

EXAMPLE 2

Plating was carried out in the same manner as in Example 1. The plating was divided in three steps, and as a coating solution, a 20% solution of a novolac type phenol resin dissolved in isopropyl alcohol was applied by spraying. Employing a nitrile rubber roll having the same hardness and size (hardness, 30; circumference, 400 mm; and surface length, 300 mm), the resin at the projected part of the metal coating was removed in the same manner as in Example 1, followed by the same operation to carry out replating. As the result of two coatings and three platings, it was possible to make the hole diameter 200 microns, and the object of the present method could be more fully attained than in Example 1.

EXAMPLE 3

A stainless steel plate (300 mm × 300 mm) was coated with a light-sensitive resin (a 7% solution of polyvinyl cinnamate resin in ethylcellosolve acetate) and an image containing a halftone was printed, followed by development with trichloroethylene and water-washing. Thereafter nickel plating was carried out in a plating bath as in Example 1 so as to give a thickness of 20 microns, followed by taking out from the plating and drying of the surface. The resulting nickel-plated stainless steel plate was put in a 20% solution of the polyvinyl cinnamate in ethylcellosolve acetate, followed by pulling up. Next, a sheet of paper was placed over the whole surface of the resin applied onto the stainless steel plate, and the resulting plate was placed and passed through between two rubber rolls, under a load of 20 Kg, at a rate of 5 cm/sec., followed by removal of the paper from the stainless steel plate and drying and degreasing and activation treatment as in Example 1. Thereafter plating was carried out in a plating bath so as to give a thickness of 20 microns. As the result of three coatings and four platings, a screen having a hole diameter of 220 microns was obtained. Thus the object of the present method could be fully satisfied.

EXAMPLE 4

By using a master roll having a dimension the same as that of Example 1 and a mesh of 150 lines/inch and embedded with an epoxy resin (Araldite) in recesses, plating treatment was carried out in a plating bath of nickel sulfamate as in Example 1 to give a nickel coating thickness of 80 microns by one time plating, whereby holes disappeared wholly. Then plating treatment was carried out to give a thickness of 20 microns the first time, and then the resin was inserted in the same manner as in Example 1 and plating treatment was carried out to give a thickness of 30 microns. The resin was inserted again in the holes in the same manner and the plating treatment was carried out to give a thickness of 30 microns. By the third plating treatment, the nickel thickness was made 20 microns whereby a nickel sleeve having a hole diameter of 60 microns could be produced.

Then the nickel sleeve was set on a vertical coating machine, and as a photosensitive resin solution, a 10% solution of ethylene glycol-dimethacrylate in ethyl cellosolve was coated to give a thickness of 30 microns. Then a line image having a line width of 200 microns was created, and by using a rotary printing machine, an aqueous acryl resin type ink as an ink, printing was carried out on papers with a squeegee made of stainless steel having a thickness of 0.2 mm and a length of blade tip of 30 mm under a squeegee pressure of 3 Kg/cm$^2$ under a printing speed of 40 m/min whereby a beautiful line image could be reproduced by printing. Line images having such a line width could not have been obtained according to the conventional method.

EXAMPLE 5

The sleeve of 150 lines/inch prepared according to the method of Example 4 was fit over an iron roll having a circumference of 600 mm and a length of 1500 mm and a film-form photosensitive resin (Riston supplied from E. I. du Pont de Nemours & Co.) consisting of 90% of poly(methyl methacrylate acrylonitrile acrylated glycidyl acrylate 65/10/25) and 10% of triethylene glycol diacetate, and having a thickness of 30μ was wound around the sleeve. As cover films, polyethylene was used for the top surface and polyester for the bottom surface and heat adhesion was carried out continuously by using an iron kept at 160° C. Thereafter according to the same process with that of Example 4, an image was developed, and by using trichloroethylene as a developer, printing was carried out as in Example 4 whereby it was possible to print fine lines having a line width of 200 microns sharply.

EXAMPLE 6

On a stainless steel roll (SUS-27, JIS) having a circumference of 640 mm and a surface length of 400 mm, a photosensitizer resin (polyvinyl cinnamate) was coated to give a membrane thickness of 5 microns. After a negative line drawing containing 150 lines/inch mesh and a line width of 200μ was printed, development was carried out with a definite developer consisting mainly of xylol to expose the metal surface of unexposed parts. After degreasing and water-washing of the exposed metal part, nickel plating was carried out in a nickel sulfamate bath to form a nickel thickness of 40 microns. After being taken out of the nickel bath, and being washed with water and dried, the plated roll was uniformly coated with a coating solution of polyvinyl butyral in cellosolve acetate by spreading the coating solution with a common rubber roll all over the surface of the plated roll. Before the coating solution was dried, a rubber roller having a Shore hardness of 60, a circumference of 700 mm and a surface length of 300 mm is brought to contact with the roll coated with the coating solution, and a load of 10 Kg was applied to this rubber roll to rotate it synchronously at a speed of 3 cm/sec. After the stainless steel roll was rotated by 2 revolutions, the rubber roll was removed. Then the stainless roll was dried with a hot air, degreased with a 2% aqueous solution of sodium hydroxide, washed with water, and plated again in a nickel plating bath to form a plating thickness of 20 microns. The coating solution was coated again and finally a plating of 20 microns was carried out to give the total plating thickness of 80 microns. After dissolving out the coated resin by using methyl ethyl ketone, nickel coating part was drawn out from the stainless steel roll and hole diameter was measured. It was found to be 60 microns. Then the nickel sleeve screen was set to a rotary screen printing machine after attachment of end rings. As the result, a line having a width of 200 microns could be reproduced.

EXAMPLE 7

A photosensitive resin, a 7% solution of naphtoquinone-1,2-diazid-5-sulfonic acid novolak ester is ethylene glycol monomethyl ether was sprayed on a stainless steel roll (SUS-27 JIS) having a circumference of 640 mm and a surface length of 400 mm to form a membrane thickness of 5 microns.

After negative graduation mesh having 150 lines/inch was exposed, development was carried out with about 5% sodium hydroxide solution to expose the metal surface of unexposed parts. The exposed parts of metal were degreased, washed with water and plated in a nickel sulfamate bath to give a thickness of plating of 40 microns. After taken out of a bath of nickel plating, washed with water and dried, the plated roll was uniformly coated with a coating solution of polyvinyl butyral in cellosolve acetate by spreading with a common rubber roll. Before the coated solution was dried, a rubber roller having a Shore hardness of 60, a circumference of 700 mm and a surface length of 300 mm was brought to contact with the roll coated with the coating solution and a load of 10 Kg was applied to this rubber roll to effect synchronous rotation at a speed of 3 cm/sec. After the stainless steel roll was rotated by two revolutions, the rubber roller was removed. Then the stainless steel roll was dried with a hot air, degreased with an aqueous dispersion of $CaCO_3$, washed with water and plated again in a nickel plating bath to give a plating thickness of 20 microns. The coating solution was coated again and finally plating of 20 microns was carried out to give the total sum of plating thickness of 80 microns. The coated solution was dissolved out by methyl ethyl ketone, the photosensitive resin was dissolved out with a weak sodium hydroxide solution and nickel coating part was drawn out from a stainless steel roll and tested whereby hole diameter of the shadow part (solid part) was 60 microns and that of the highlight part was 10 microns. Then the plated roll was mounted on a rotary screen printing machine to effect printing after attachment with end rings.

As the result, the graduation which has not been heretofore produced, could be obtained.

EXAMPLE 8

As one example of application to a high-mesh filter, a cylindrical iron roll having a diameter of 60 mm and a height of 120 mm was made. After the surface of this roll was polished, copper plating was carried out in a copper cyanide plating bath to form a copper plating of 200 microns. Next, after the copper surface was polished to form a mirror surface, 150 lines per inch holes were made. The whole surface was plated in a chromium plating bath to form a chromium plating thickness of 5 microns. After finishing of chromium plating, the plated roll was washed with water sufficiently and dried. In the recessed parts, an epoxy resin was stuffed and the surface was polished to form a smooth surface. Resultant matrix was subjected to nickel plating in three steps to increase its thickness by 30 microns in the first step, $25\mu$ in the second step and $25\mu$ in the third step. Further between each two steps, coatings of resin solution were carried out as in the precedent examples, whereby products obtained were found to be useful sufficiently as filters. They are now being used as filters of juicers.

What is claimed is:

1. A method for producing screens by a plating process comprising the steps of:
   (1) plating a master roll or plate, having a pattern of conductive metal and non-conductive areas on the surface thereof, with a plurality of separate coats of a metal coating on said conductive areas in order to build up a plurality of spaced projecting metal parts having a required thickness;
   (2) between each of the separate platings, applying a non-electrically conductive resin onto the entire surface of a said separate metal coating; and
   (3) removing said non-electrically conductive resin from the top of each of said separate metal coatings on said projecting parts while said non-electrically conductive resin is in an undried state, said removal being performed by means of a roll comprised of a natural or synthetic rubber receptive to said non-electrically conductive resin, so as to expose the surface of said metal coating.

2. A method for producing screens for printing according to claim 1 wherein said master roll or plate has been made by a lacquer process.

3. A method for producing screens for printing according to claim 1 wherein said master roll or plate has been made by an electroplate process.

4. A method of producing screens as in claim 1 wherein the treated roll or plate is dried after each performance of step (3).

5. A method for producing screens as in claim 1 wherein said roll has a rubber or synthetic layer having a hardness of 10 to about 100 shore.

6. A method of producing screens as in claim 5 wherein said resin is removed by said roll by applying a roll pressure of 0.5 to about 10 kg/24.5 cm.